United States Patent [19]
Gentzler

[11] Patent Number: 6,046,635
[45] Date of Patent: Apr. 4, 2000

[54] DYNAMIC PREDISTORTION COMPENSATION FOR A POWER AMPLIFIER

[75] Inventor: Charles R. Gentzler, Thousand Oaks, Calif.

[73] Assignee: Powerwave Technologies, Inc., Irvine, Calif.

[21] Appl. No.: 09/057,332

[22] Filed: Apr. 8, 1998

[51] Int. Cl.[7] .................................................. H03F 1/26
[52] U.S. Cl. ........................................... 330/149; 330/151
[58] Field of Search ..................................... 330/149, 151

[56] References Cited

U.S. PATENT DOCUMENTS

| | | | |
|---|---|---|---|
| 3,471,798 | 10/1969 | Seidel | 330/149 |
| 3,725,806 | 4/1973 | Darlington | 330/149 |
| 3,755,754 | 8/1973 | Putz | 330/149 |
| 3,825,843 | 7/1974 | Felsberg et al. | 328/163 |
| 4,258,328 | 3/1981 | Prevot et al. | 330/149 |
| 4,291,277 | 9/1981 | Davis et al. | 330/149 |
| 4,554,514 | 11/1985 | Whartenby et al. | 330/149 |
| 4,564,816 | 1/1986 | Kumar et al. | 330/149 |
| 4,588,958 | 5/1986 | Katz et al. | 330/149 |
| 4,879,519 | 11/1989 | Myer | 330/149 |
| 4,882,547 | 11/1989 | Katz | 330/149 |
| 4,943,782 | 7/1990 | Nojima | 330/149 |
| 5,049,832 | 9/1991 | Cavers | 330/149 |
| 5,132,639 | 7/1992 | Blauvelt et al. | 330/149 |
| 5,164,678 | 11/1992 | Puri et al. | 328/163 |
| 5,166,634 | 11/1992 | Narahashi et al. | 330/151 |
| 5,170,495 | 12/1992 | McNicol et al. | 455/116 |
| 5,193,224 | 3/1993 | McNicol et al. | 455/116 |
| 5,237,288 | 8/1993 | Cleveland | 330/107 |
| 5,252,930 | 10/1993 | Blauvelt | 330/149 |
| 5,334,946 | 8/1994 | Kenington et al. | 330/144 |
| 5,444,418 | 8/1995 | Mitzlaff | 330/52 |
| 5,493,252 | 2/1996 | Takai | 330/52 |
| 5,523,716 | 6/1996 | Grebliunas et al. | 330/149 |
| 5,524,286 | 6/1996 | Chiesa et al. | 455/126 |
| 5,594,385 | 1/1997 | Anvari | 330/149 |
| 5,789,976 | 8/1998 | Ghannouchi et al. | 330/52 |
| 5,867,064 | 2/1999 | Van Horn et al. | 330/149 |

*Primary Examiner*—Robert Pascal
*Assistant Examiner*—Henry Choe
*Attorney, Agent, or Firm*—Fish & Richardson P.C.

[57] ABSTRACT

The invention relates to an amplifier arrangement for amplifying an input using a distorting main power amplifier such as one operating as a class AB amplifier. The method and apparatus add to the input signal to the main amplifier a predistortion signal intended to compensate for the distortion added by the main power amplifier. In accordance with the invention, the predistortion signals can be dynamically modified to improve, substantially, at least the third order intermodulation components in the output of the power amplifier. A digitally controlled processor iteratively modifies various phase and gain controls to adjust the output of the amplifier. Different gain and phase control lines are iteratively updated at different rates.

18 Claims, 2 Drawing Sheets

DYNAMIC PREDISTORTION COMPENSATION FOR A POWER AMPLIFIER

BACKGROUND OF THE INVENTION

The invention relates generally to power amplifiers, and in particular to linearizing the input/output transfer function for amplifiers, particularly high power class AB power amplifiers.

High power, broad band power amplifiers are well known. These amplifiers may operate in a feed forward configuration, or may have other forms of linearization which are required when the main power amplifier operates, for example, as a class AB amplifier. Although class A amplifiers usually produce less distortion than class AB amplifiers, class A amplifiers are also less efficient than class AB amplifiers. Thus, in order to retain the advantages of efficiency while minimizing distortion, class AB amplifier configurations have been developed which implement various forms of error or distortion correction.

One form of error correction attempts to distort the input signal in a manner which compensates for the distortions of the class AB amplifier. Thus, a predistortion circuit can be provided with various manual adjustments to produce a distortion signal from the original signal, so that when the distortion signal is combined with the input signal, and the combination is input to the power amplifier, operating for example, as a class AB amplifier, the output is substantially a linear amplification of the original input signal to the amplifier arrangement.

Such predistortion circuities typically employ a low power amplifier, preferably having the same general distortion characteristics as the main amplifier, so that its output, properly processed, can be used to obtain the necessary distortion components required to be combined with the input signal to the predistortion circuitry to generate a predistorted input to the main amplifier. Such configurations operate to substantially reduce the intermodulation frequency distortions produced by a class AB amplifier when the variable elements of the predistortion circuitry are properly adjusted.

However, even in properly adjusted amplifier arrangements using predistortion, a certain amount of instability can be observed. Specifically, amplifier component drift can be caused by temperature transients, and if the amplifier characteristics are sensitive to average power input, there can be further amplifier instability. Typically, however, these parameters are relatively slowly varying (for example a typical response time would be on the order of one millisecond); and even a low bandwidth amplifier has a signal bandwidth of one megahertz which corresponds to a period of one microsecond. While these instabilities have been attended to in a feed forward cancellation loop circuitry, for example, they are not adequately handled in a predistortion arrangement. Thus, the invention provides an advantageous approach toward maintaining stability in the input/output relationship of a high power class AB power amplifier arrangement. There results better linear stability over time and lower intermodulation distortions in the amplifier output.

SUMMARY OF THE INVENTION

The invention relates to an amplifier arrangement for amplifying an input signal with which a distortion cancelling input is combined. The amplifier arrangement features a main amplifier (typically a class AB amplifier), an error loop including a comparator which differences a delayed derivative of the input signal to the amplifier arrangement with a signal representative of the output of the main amplifier to produce an error signal, a first distortion controlled feedback loop including a detector for receiving the error signal and generating a detected error signal output, and a distortion signal generation circuit for generating a predistortion signal. The distortion signal generation circuit has an auxiliary amplifier for receiving a signal derived from the input signal and for generating an auxiliary signal output, and a signal correction circuit for receiving the auxiliary signal output and for adjusting the auxiliary signal output amplitude and phase. The distortion signal generation circuit further includes a first combiner for combining a delayed version of the input signal with an output of the signal correction circuitry for generating a distortion components signal. A second combiner combines the distortion components signal with a delayed replica of the input signal for input to the main amplifier. The controlled feedback loop further features a compensation circuit connected to the detected error signal output of the detector for generating predistortion control signals to the correction circuitry. The detector extracts information from the error signal to generate the control signals for minimizing the detected error signal output.

In another aspect of the invention, the error loop features an error loop delay circuit connected to receive a signal derived from the input signal to be amplified and an error loop phase and amplitude correction circuit connected in series with the error loop delay circuit, the error loop delay circuit and the error loop phase and gain correction circuits together generating the delayed derivative of the input signal.

The amplifier further features a detector which, in one embodiment, has an energy measurement circuit for measuring the energy in the error signal and a compensation circuit which has a control processor responsive to the energy measurement circuit for iteratively adjusting the error correction circuitry amplitude and phase. Preferably, the control processor operates cyclicly for adjusting the phase correction control circuit and then the gain correction control circuit, in a continuously repeating pattern, to reduce the error signal.

In another aspect, the amplifier arrangement further has a delay for receiving a signal derived from the input signal to the amplifier arrangement and for providing the delayed version of its input as its delayed signal output to the first combiner, the first combiner outputting a difference between the delayed version output of the delay and an output derived from the auxiliary amplifier, a second phase correction circuit and a second gain correction circuit, the second phase and gain correction circuits providing phase and gain correction to the output of the first comparer prior to combining with the delayed replica.

In a particular aspect, a second detection circuit receives an output derived from the first combiner for generating a distortion error signal, and the control processor is responsive to the distortion error signal for iteratively adjusting the first phase and gain correction circuits, while the control processor is responsive to the error signal for iteratively adjusting the second phase and gain correction circuits and the error loop phase and gain correction circuits. The control processor sets a priority based upon the frequency with which the circuits are iteratively adjusted. Thus, for example, the control processor will adjust the second phase and gain correction circuits much more often then the first phase and gain correction circuits.

The method of the invention relates to correcting distortion in an amplified signal output from a main amplifier (preferable operating as a class AB amplifier) which is part of an amplifier arrangement having an input and an output, the method combining predistortion signals with the input to the amplifier for delivery to the main amplifier. The method features the steps of generating predistortion signals in a predistortion circuit, derived from an input to the amplifier arrangement; generating an error signal from the output of the main amplifier representing distortion error energy, and iteratively and successively correcting, using a digitally controlled processor responsive at least to signals derived from the error signal, phase and gain adjustments in the predistortion circuit.

In various aspects of the invention, the error signal generating step features comparing a signal derived from the output of the main amplifier and a signal derived from the input signal to the amplifier arrangement, generating a difference signal, and then measuring an energy content of a signal derived from the difference signal. The method further features passing a signal through an auxiliary amplifier having distortion characteristics similar to those of the main amplifier, iteratively adjusting the phase and gain operating on the output of the auxiliary amplifier using the digitally controlled processor, and iteratively adjusting a phase and gain of a delayed input replica signal using the same digitally controlled processor, said adjusted replica signal being used to generate the error signals.

The invention thus advantageously predistorts, in a dynamic manner, the input signal to a class AB or other distorting main amplifier and thereby causes a substantial linearization of the input-output characteristics of the entire amplifier arrangement. The dynamic character of the system adjusts for various instabilities including those caused by temperature and signal level.

BRIEF DESCRIPTION OF THE DRAWINGS

Other objects, features, and advantages of the invention will be apparent from the following description, taken together with the drawings in which.

DESCRIPTION OF THE PREFERRED EMBODIMENTS

Figure 1:
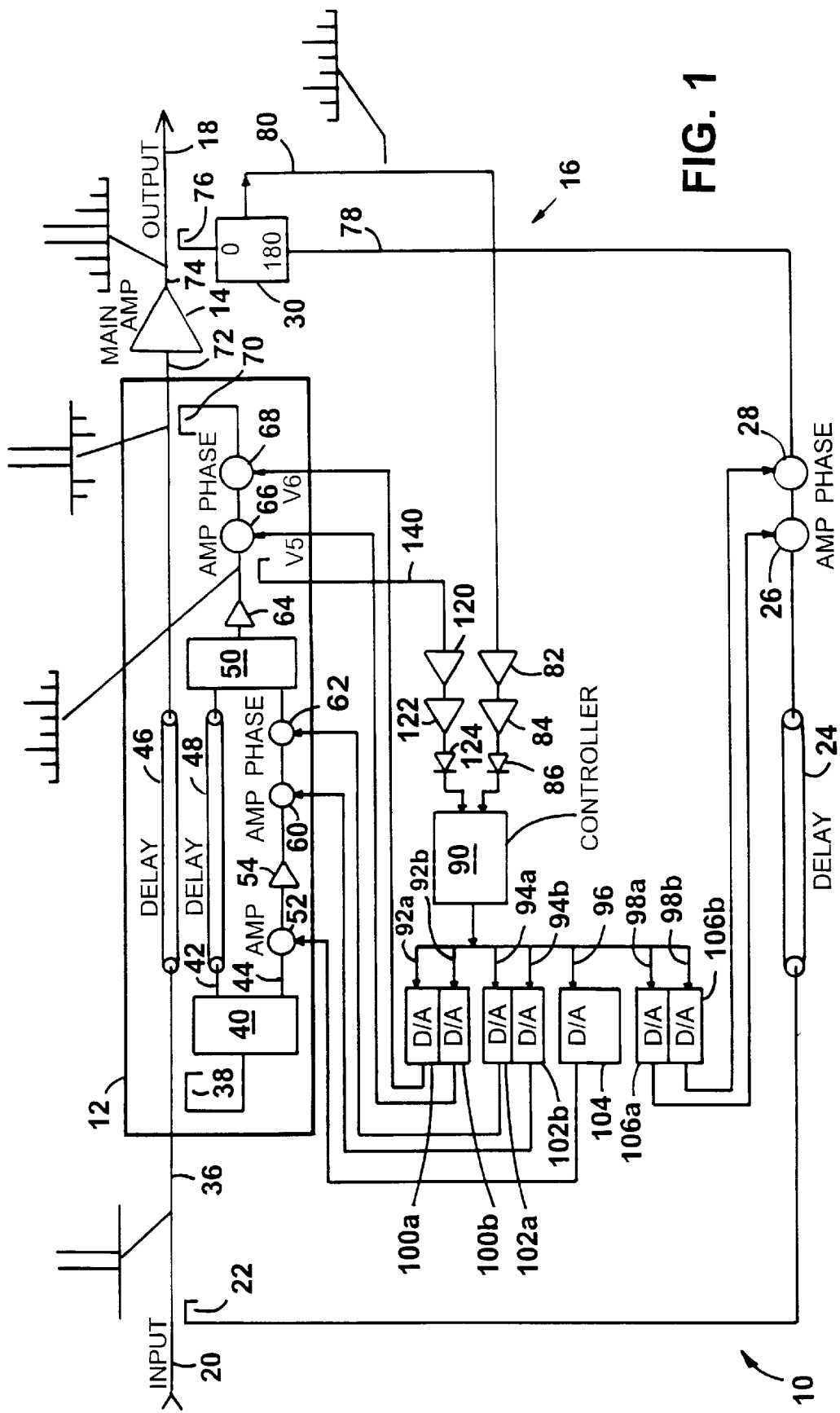
FIG. 1 is a schematic block diagram of a preferred embodiment of the predistorter amplifier and control circuitry in accordance with the invention.

Referring to FIG. 1, an amplifier arrangement 10 has a predistortion circuitry 12, a main power amplifier 14, and a control circuitry 16. Amplifier 14 is typically a high power class AB amplifier whose output over a line 18 can be either used directly, or can be the input to a feed forward distortion cancellation circuitry such as that described in my copending U.S. application Ser. No. 08/639,264, entitled BROADBAND AMPLIFIER WITH QUADRATURE PILOT SIGNAL, filed Apr. 24, 1997, the contents of which are incorporated herein by reference.

The input to the amplifier arrangement, over a line 20, is split (or sampled) for a number of purposes. First, a line sampling coupler 22 directs part of the input signal to a delay element 24. The output of the delay element is directed to a controlled gain circuitry 26 and from there to a controlled phase circuitry 28. The output of the phase circuitry 28 is passed to a comparison device 30. (The processing order of delay 24, and circuities 26, 28 is not important.)

The remaining input signal over line 36 is sampled by another coupler 38 and the output of coupler 38 is received by a signal splitter 40 which divides the signal equally for output over lines 42 and 44. The remaining input signal from line 36 is directed to a delay element 46.

The output of splitter 40 over line 42 is directed to a delay element 48, the output of which is received by comparison circuitry 50. The other output of splitter 40 over line 44 is received by a gain controlled amplifier 52, the output of which is directed to an auxiliary amplifier 54. The output of amplifier 54 is received by a controlled gain circuitry 60. The output of controlled gain circuitry 60 is delivered to a controlled phase circuitry 62 the output of which is compared with the signal from delay element 48 in comparison circuitry 50. The difference between the two signals, representing distortion components introduced primarily by amplifier 54, is passed through a linear amplifier 64 to a controlled gain circuit 66. The output of the control gain circuit 66 is received by a controlled phase circuit 68. The output of the controlled phase circuit 68 is delivered to a coupler 70 which combines the output of the phase circuit 68 with the output of the delay element 46, to generate an input, over a line 72, to the main power amplifier 14.

The output of the main power amplifier 14, over a line 74, is sampled by a coupler 76 and the sampled output signal is compared (differenced) to the output of the phase controlled circuit 28 available over a line 78, to generate a distortion error signal on a line 80. The distortion error signal over line 80 is amplified using amplifiers 82 and 84, connected in series with each other, and the output of amplifier 84 is detected, here using a Schottky diode 86 to measure the energy in the signal, for input to a digital controller 90. The digital controller 90 outputs, in this illustrated embodiment, seven digital signals over lines 92a, 92b, 94a, 94b, 96, 98a, and 98b to control digital to analog (D/A) converters 100a, 100b, 102a, 102b, 104, 106a, and 106b, respectively. The analog outputs of the digital to analog converters are directed to control the various gain and phase elements of the predistortor circuitry 12 and the feedback control circuitry gain and phase 26 and 28.

The output of the comparison circuit 50, amplified by amplifier 64 to give it a proper signal value for eventual coupling into the output from the delay element 46, is sampled by a coupler 118. The output of the coupler, like the output of comparison circuitry 30, is passed through a pair of amplifiers 120, 122, and is detected at the output of amplifier 122, in the illustrated embodiment of the invention, using a Schottky diode 124, which provides a measure of the energy in the signal output of amplifier 122. That energy value is received by the controller 90 which uses that value to adjust and control the value of the gain at circuits 52 and 60, and the phase correction at circuit 64.

The circuit arrangement 10 thus has three loops in operation. One loop the first distortion loop, includes delay 48, amplifier 52, auxiliary amplifier 54, gain and phase correction circuits 60 and 62, and comparison circuitry 50. The second distortion loop includes those previous elements, and further, linear amplifier 64, and gain and phase correction circuits 66 and 68, along with delay 46. The system error loop includes those previously identified elements plus the main amplifier 14, delay 24, gain and phase correction elements 26 and 28, and comparison circuitry 30. The loops are controlled by the error correction circuitry including the processor 90, the A-to-D's 100a, 100b, 102a, 102b, 104, 106a, and 106b, the amplifiers 82, 84, 120, 122, and the detection elements, here the Schottky diodes, 86 and 124.

The circuit arrangement operates as follows. A sample of the input over line 20 is obtained by coupler 38 and is directed through the voltage variable splitter/attenuator 40 to the linear amplifier 52. The purpose of the linear amplifier is to increase the signal level to drive the auxiliary amplifier 54 which has been designed to produce substantially, to the extent possible, the same magnitude and type of distortion as the main amplifier 14. The output of the distortion auxiliary amplifier is adjusted by gain and phase correction circuits 60 and 62 and then subtracted from the delayed version of the input signal, from delay 48, to cancel the main input signal in the output of the auxiliary amplifier 54 leaving the distortion, at the output of comparator 50. These distortion products are then again amplified, and phase and amplitude corrected, passing through amplifier 64 and then gain and phase correction circuitry 66 and 68. The output of phase correction circuitry 68 is then injected 180° out of phase with the original signal.

The distortion products of a similar nonlinear device (amplifier 54) injected 180° degrees out of phase with the desired signal from delay 46, improves the apparent linearity of the following nonlinear power amplifier 14 operating, for example, as a class AB amplifier. The improvement occurs typically in the third order intermodulation products, and is less for the high order products.

The output of the main amplifier is also sampled by coupler 76. The comparison circuit 30 then compares the sampled output of the main amplifier with the original input signal processed as follows. A sample of the original input signal on line 20 is obtained from coupler 22 and passes through delay line 24. The delay lines 24, 46, and 48 are all selected to maintain the signals in time phase as they are coupled together, taking into account the delays inherent in the amplifier and correction circuities. The delayed output of delay element 24 is phase and gain corrected and delivered to the comparison circuitry 30, the output of which is a measure of the distortion products at the main amplifier output after a null has been obtained. This nulled signal is then used, in part, to control the various elements of the predistortion circuitry 12 and the nulling feed forward circuits 26, 28, to optimize operation at any given power level, temperature, tone spacing, etc.

Referring to the correction and control circuitry 16, the error signal output from comparison circuitry 30 is amplified and isolated by amplifiers 82 and 84, is detected using the Schottky diode 86, in this illustrated embodiment of the invention, and is provided as an input to the processor 90. As noted above, the processor 90 also receives an input from the predistortion circuitry, where the output of the linear amplifier 64, which contains the distortion output from the first distortion loop, is passed through and isolated by amplifiers 120, 122, and detected by Schottky diode 124. In essence, the Schottky diodes measure the energy contained in the signal applied to them and that energy signal is provided to the controller 90 (through analog to digital converters (not shown)).

The controller 90 operates on a priority basis, as described below, and based upon the energy inputs applied to it, and its program priority basis, continuously and iteratively outputs digital signal values to the D to A converters. The D to A converters, upon receiving a new digital signal value, convert their digital inputs to an analog signal output for controlling the various phase and gain elements of the circuitry, that is, the amplifier 52 before the auxiliary amplifier 54, and the gain and phase correction circuits 60, 62, 66, 68, and 26, 28. As these circuits vary in gain and/or phase, the effect is to linearize the input/output relationship from the input signal 20 to the output signal 18 for the entire circuit arrangement. This is performed, as described above, by adding distortion signals (predistorting) to the input of the main amplifier so that the overall response at the output of the main amplifier is linear with respect to the input signal over line 20.

Figure 2:
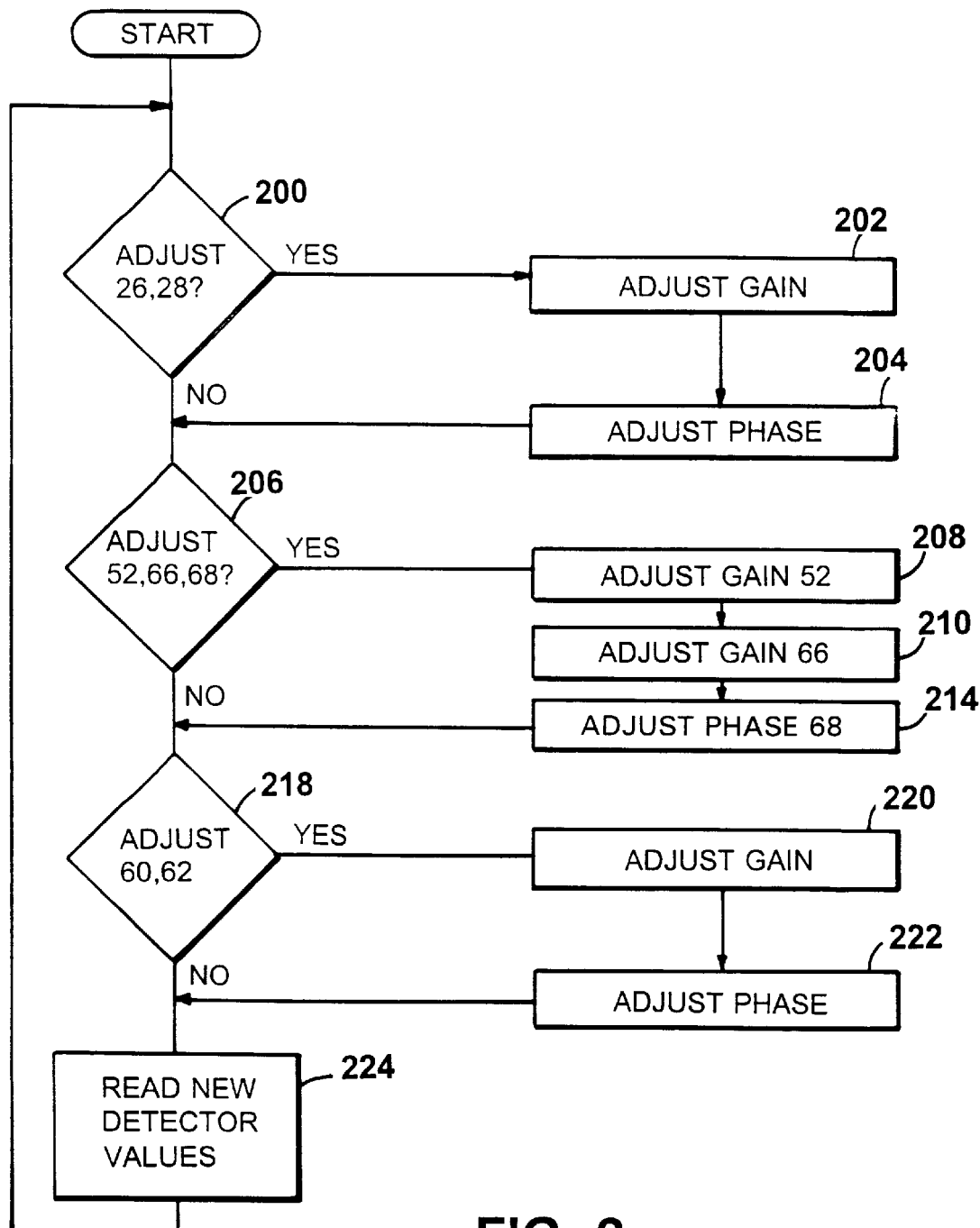
FIG. 2 is a flow chart illustrating operation of the digitally controlled processor in accordance with a preferred embodiment of the invention.

In operation, controller 90 operates substantially in a feedback loop environment. It iteratively adjusts the varying control elements to which it is connected and determines whether the adjustment improves, has no effect, or renders worse, the error products such as the output of the first distortion loop on line 140 or in the error output of the overall device on line 80. The object is to minimize the distortion at the output of linear amplifier 14 upon reaching a null at the output of comparator 30. In performing this process, referring to FIG. 2, the controller operates to give highest priority to the gain and phase control circuits 26, 28, which operate at approximately a millisecond cycle time as opposed to a lower priority in controlling the operation of gain and phase correction circuities 60 and 62 which are updated approximately every three to four milliseconds; and a lowest priority to the adjustment of amplifier 52 and gain and phase correction circuities 66 and 68 which are corrected approximately every 50 milliseconds. The control processor can be for example a model MC68HC11E9 processor manufactured by Motorola.

Accordingly, in operation, controller 90 loops between the various correction circuities in order to continuously maintain and update the correction output values. Thus, once started (referring to FIG. 2) the system first checks whether to adjust gain and phase correction circuits 26, 28. This decision can be based, for example, upon an internal clock measurement so that these elements can be updated every millisecond. This is tested at step 200. If the elements are to be adjusted, then the gain can be adjusted at step 202 and the phase can be adjusted at step 204, after which control returns to the main loop. Thereafter, the system determines whether to adjust the control voltages to gain amplifier 52, gain correction circuit 66, and gain correction circuit 68. If, the decision at step 206 is "yes", the control signals to each of the three elements are adjusted in sequence at steps 208, 210, and 214. Control then again returns to the main loop. Finally, the system checks at 218 whether to adjust the signals controlling gain and phase correction circuits 60 and 62. If the gain and phase are to be adjusted, the system then adjusts, as necessary, those elements at 220 and 222 and control returns to the main loop. The next step reads new detector values at the inputs from detection elements 86 and 124. This is indicated at step 224.

In the preferred embodiment of the invention, gain and phase correction circuitries 26 and 28 are adjusted based solely upon the error signal value from detector 86. Similarly, gain element 52 and gain and phase correction circuitries 66 and 68 are also determined based solely on the signal level of detector 86. Finally, the gain and phase correction circuits 60 and 62 are adjusted based solely upon the detector output measurements of detector 124.

Additions, subtractions, and other modifications of the described and preferred embodiment of the invention will be apparent to those practiced in this field and are within the scope of the following claims.

What is claimed is:

1. An amplifier arrangement for amplifying an input signal with which a distortion cancelling input is combined, said amplifier arrangement comprising:

a main amplifier, an error loop including a comparator which differences a delayed derivative of said input signal to said amplifier arrangement with a signal representative of the output of said main amplifier to provide an error signal;

a first distortion controlled feedback loop including a detector for receiving said error signal and generating a detected error signal output; and a distortion signal generation circuit for generating a predistortion signal having an auxiliary amplifier for receiving a signal derived from said input signal and generating an auxiliary signal output, signal correction circuitry for receiving the auxiliary signal output for adjusting said auxiliary output signal gain and phase, and, a first combiner for combining a delayed version of said input signal with an output of said signal correction circuitry for generating a distortion components signal, a second combiner for combining said distortion components signal with a delayed replica of said input signal for input to said main amplifier, and said controlled feedback loop further comprising a compensation circuit connected to the detected error control signal output of the detector for generating predistortion control signals to the correction circuitry, said detector extracting information from said error signal and said control signals minimizing said detected error signal output.

2. The amplifier arrangement of claim 1 wherein said main amplifier is a broadband radio frequency amplifier operating in a class AB mode.

3. The amplifier arrangement of claim 1 further comprising a phase and a gain correction circuitry in said error loop for adjusting said input signal.

4. The amplifier arrangement of claim 1 further wherein:

said error loop comprises an error loop delay circuit connected to receive a signal derived from said input signal to be amplified, and an error loop phase and gain correction circuitry connected in series with said error loop delay circuit, said error loop delay circuit and said error loop phase phase and amplitude correcting circuitry together generating said delayed derivative of said input signal.

5. The amplifier arrangement of claim 4 further wherein said detector comprises an energy measurement circuit for measuring the energy in said error signal, and said compensation circuit comprises a control processor, responsive to the energy measurement circuit, for iteratively adjusting the signal correction circuitry amplitude and phase.

6. The amplifier arrangement of claim 5 wherein said distortion signal generating circuit comprises a first gain correction circuit and a first phase control circuit, and said control processor comprises:

a controller for cyclically adjusting said phase correction control circuit, and then said gain correction control circuit, in a continuously repeating pattern.

7. The amplifier arrangement of claim 5 wherein said energy measurement circuit is a Schottky diode circuit.

8. The amplifier arrangement of claim 6 wherein said phase and gain correction circuits provide phase and gain correction at said auxiliary amplifier output.

9. The amplifier arrangement of claim 8 further comprising a delay for receiving a signal derived from said input signal and for providing said delayed version of its input as its delayed signal output to said first combiner, said first conbiner outputing a difference between the delayed version output from the delay and the auxiliary amplifier derived output, a second phase correction circuit, a second gain correction circuit, and said second phase and gain correction circuits providing phase and gain correction to the output of said first comparer prior to combining with said delayed replica.

10. The amplifier arrangement of claim 9 further comprising a second detector circuit for receiving an output derived from said first combiner for generating a distortion error signal, said control processor being responsive to said distortion error signal for iteratively adjusting the first phase and gain correction circuits, said control processor being responsive to said error signal for iteratively adjusting said second phase and gain correction circuits and said error loop phase and gain correction circuits, and said control processor sets a priority upon a frequency with which the circuits are iteratively adjusted.

11. The amplifier arrangement of claim 10 further comprising a linear amplifier responsive to the output of the first combiner for amplifying said first combiner output signal and delivering the amplified output to said second gain and phase correction circuits.

12. The amplifier arrangement of claim 10 further comprising, in said distortion loop, a gain control circuit at the input to said auxiliary amplifier, and said control processor interactively controls the gain of said gain control circuits in responsive to said processor's input signals.

13. The amplifier arrangement of claim 5 further wherein said control processor is responsive for iteratively controlling, at a low priority, said gain and phase control circuitry of said in said error control loop, in response to said error signal detection circuitry.

14. A method of correcting distortion in an amplified signal output from a main amplifier of an amplifier arrangement, said main amplifier being part of the amplifier arrangement and the arrangement having an input and an output, said method combining predistortion signals with the input to said amplifier arrangement for delivery to said main amplifier, comprising the steps of:

comparing a delayed derivative of said input signal to said amplifier arrangement with a signal representative of the output of said main amplifier to provide an error signal, receiving said error signal, generating a detected error signal output representing distortion error energy;

generating said predistortion signals in a predistortion circuit, derived from an input to said amplifier arrangement comprising receiving a signal derived from said input signal and generating an auxiliary signal output, receiving the auxiliary signal output for adjusting said auxiliary output signal gain and phase, and, combining a delayed version of said input signal with said auxiliary output for generating a distortion components signal representing distortion error energy, combining said distortion components signal with a delayed replica of said input signal for input to said main amplifier, iteratively and successively correcting, using a digitally controlled processor responsive at least to signals extracted from said error signal, phase and gain adjustments in said predistortion circuit to minimize said detected error signal output.

15. The method of claim 14 wherein said interactively correcting step is responsive to distortion error signals generated within said predistortion circuit.

16. A method of correcting distortion in an amplified signal output from a main amplifier of an amplifier arrangement, said main amplifier being part of the amplifier arrangement and the arrangement having an input and an output, said method combining predistortion signals with the input to said amplifier arrangement for delivery to said main amplifier, comprising the steps of:

generating said predistortion signals in a predistortion circuit, derived from an input to said amplifier arrangement, generating an error signal from the output of the main amplifier representing distortion error energy, iteratively and successively correcting, using a digitally controlled processor responsive at least to signals derived from said error signal, phase and gain adjustments in said predistortion circuit, said interactively correcting step being responsive to distortion error signals generated within said predistortion circuit, wherein said error signal generating step comprises the step of comparing a signal derived from the output of the main amplifier and a signal derived from the input signal to the amplifier arrangement for generating a difference signal, and measuring an energy content of a signal derived from said difference signal.

17. A method of correcting distortion in an amplified signal output from a main amplifier of an amplifier arrangement, said main amplifier being part of the amplifier arrangement and the arrangement having an input and an output, said method combining predistortion signals with the input to said amplifier arrangement for delivery to said main amplifier, comprising the steps of:

generating said predistortion signals in a predistortion circuit, derived from an input to said amplifier arrangement, generating an error signal from the output of the main amplifier representing distortion error energy, iteratively and successively correcting, using a digitally controlled processor responsive at least to signals derived from said error signal, phase and gain adjustments in said predistortion circuit, passing a signal through an auxiliary amplifier having distortion characteristics similar to those of said main amplifier, iteratively adjusting the phase and gain operating on an output of said auxiliary amplifier using said digitally controlled processor, and interactively adjusting a phase and gain of a delayed input replica signal using said digitally controlled processor, said adjusted replica signal being used to generate said error signal.

18. The method of claim 17 further comprising the step of performing said iterative adjusting and correcting steps at different periodic rates.

* * * * *